US007855635B2

(12) United States Patent
Cohn et al.

(10) Patent No.: US 7,855,635 B2
(45) Date of Patent: Dec. 21, 2010

(54) METHOD AND SYSTEM FOR COUPLING AN ALARM SYSTEM TO AN EXTERNAL NETWORK

(75) Inventors: Alan Wade Cohn, Austin, TX (US); Ronald E. Battles, Cedar Park, TX (US); David Proft, Austin, TX (US); Scott William Shumate, Austin, TX (US)

(73) Assignee: uControl, Inc., Austin, TX (US)

( * ) Notice: Subject to any disclaimer, the term of this patent is extended or adjusted under 35 U.S.C. 154(b) by 261 days.

(21) Appl. No.: 11/712,175

(22) Filed: Feb. 28, 2007

(65) Prior Publication Data

US 2008/0204219 A1 Aug. 28, 2008

(51) Int. Cl.

*G08B 29/00* (2006.01)
*G09F 25/00* (2006.01)
*H04L 12/28* (2006.01)
*H03K 17/94* (2006.01)
*H03M 11/00* (2006.01)

(52) U.S. Cl. .................. 340/506; 340/286.02; 370/257; 341/22

(58) Field of Classification Search ......... 340/500–513, 340/541–567, 691.1–691.6, 693.5–693.12, 340/3.2–3.32, 3.7, 3.9, 825.36–7.61, 286.01, 340/286.02, 815.48, 815.49; 709/22, 23; 370/230, 245, 250, 257; 341/22, 26

See application file for complete search history.

(56) References Cited

U.S. PATENT DOCUMENTS 4,951,029 A * 8/1990 Severson .................... 340/506
5,134,644 A 7/1992 Garton et al. ................. 379/39
5,438,607 A 8/1995 Przygoda, Jr. et al. ......... 379/38
5,499,014 A 3/1996 Greenwaldt ................. 340/539
5,625,338 A * 4/1997 Pildner et al. ............ 340/539.3
5,717,379 A 2/1998 Peters ........................ 340/539
5,777,551 A 7/1998 Hess .......................... 340/541
5,892,442 A 4/1999 Ozery ........................ 340/539
5,943,394 A 8/1999 Ader et al. .................... 379/40
6,032,036 A 2/2000 Maystre et al. ............. 455/404
6,038,289 A 3/2000 Sands .......................... 379/26
6,049,272 A 4/2000 Lee et al. .................... 340/539
6,049,273 A 4/2000 Hess .......................... 340/539

(Continued)

*Primary Examiner*—Jennifer Mehmood
(74) *Attorney, Agent, or Firm*—Campbell Stephenson LLP; Jonathan N. Geld

(57) ABSTRACT

A communication system is provided that can be added to a legacy alarm system to provide a plurality of communication modes to a remote server system from the legacy alarm system and provide remote control and monitoring to a user of the system via two-way communication links. The communication system can be configured to communicate with an alarm processor of the legacy alarm system through use of a keypad bus typically used by the legacy alarm system for communications between the alarm processor and one or more keypads. Communication modes that can be provided by embodiments of the present invention can include, for example, communication over a public switched telephone network, cellular transmission, broadband transmission, wireless broadband, and the like. The communication system can monitor all configured communication modes and determine which communication mode is the best for providing communication between the alarm system and the remote server. Through these communication modes and by virtue of being coupled to the alarm processor via the keypad bus, the communication system can provide both transmission to the remote server of the status and alarm condition of the legacy alarm system as well as provide control signals from the remote server to the legacy alarm system.

27 Claims, 6 Drawing Sheets

U.S. PATENT DOCUMENTS

| | | | | |
|---|---|---|---|---|
| 6,052,052 | A | 4/2000 | Delmonaco | 340/539 |
| 6,067,346 | A | 5/2000 | Akhteruzzaman et al. | 379/39 |
| 6,433,683 | B1 * | 8/2002 | Robinson | 340/540 |
| 6,661,340 | B1 | 12/2003 | Saylor et al. | 340/517 |
| 6,693,545 | B2 * | 2/2004 | Brown et al. | 340/573.1 |
| 6,956,477 | B2 | 10/2005 | Chun | 340/541 |
| 7,053,764 | B2 * | 5/2006 | Stilp | 340/506 |
| 7,248,161 | B2 * | 7/2007 | Spoltore et al. | 340/539.14 |
| 2003/0061344 | A1 * | 3/2003 | Monroe | 709/224 |
| 2003/0062997 | A1 | 4/2003 | Naidoo et al. | 340/531 |
| 2005/0024203 | A1 * | 2/2005 | Wolfe | 340/539.22 |
| 2005/0216580 | A1 | 9/2005 | Raji et al. | 709/223 |
| 2007/0226182 | A1 * | 9/2007 | Sobotka et al. | 707/3 |

* cited by examiner

METHOD AND SYSTEM FOR COUPLING AN ALARM SYSTEM TO AN EXTERNAL NETWORK

CROSS REFERENCE TO RELATED APPLICATION

This application claims priority to application Ser. No. 12/732,879 filed on Mar. 26, 2010, claiming the benefit of U.S. provisional application 61/174,366, filed on Apr. 30, 2009.

FIELD OF THE INVENTION

The present invention relates to the field of security systems, and more particularly relates to coupling a legacy alarm system to a server coupled to an external network via a plurality of monitored communication modes, enabling two-way communication between the server and the legacy alarm system.

BACKGROUND OF THE INVENTION

Security systems alert occupants of a dwelling and emergency authorities of a violation of premises secured by the security system. A typical security system includes a controller connected by wireless or wired connections to sensors deployed at various locations throughout the secured dwelling. In a home, sensors are usually deployed in doorways, windows, and other points of entry. Motion sensors can also be placed strategically within the home to detect unauthorized movement, while smoke and heat sensors can detect the presence of fire.

Security systems are usually connected to a central monitoring service system via a telecommunications line coupled to a public switched telephone network (PSTN). The central monitoring service system can be maintained by a security service provider and continuously monitors all activated subscriber security systems for alarms. Sensor activity occurs when a sensor detects, for example, an opening of a door or window, or presence of movement, or a fire. Sensor activity causes the sensor to send a signal to the controller of the security system. Responsive to receiving the signal, the controller can determine whether the signal represents an alarm condition and, if so, issue an audible alarm to alert the occupants of the dwelling and can originate a data transmission to the central monitoring service system via the telecommunications line. Upon receiving notification of an alarm, the central monitoring service system can determine the type of activity, attempt to contact the dwelling occupants, and alert appropriate authorities of an emergency situation.

Typically, the telecommunications line interconnecting the security system to the central monitoring service system is the dwelling occupant's telephone line. This line usually emanates and is accessible from the exterior of the dwelling. It is this telecommunications line which delivers a security breach signal to the central monitoring service system via a PSTN.

One drawback of such a security system is that the telecommunications line becomes a potential single point of failure for providing a security breach signal to the central monitoring service system. Should the telephone line be rendered inoperative, for example, by an intruder cutting the telecommunications line prior to attempting entry, or due to other types of telecommunications systems failure, then the security breach signal will fail to be provided to the central monitoring service system and further action, such as notification of the authorities will not occur. Such links between a security system and a central monitoring service system are typically one-way, providing only data from the security system to the central monitoring system, which is another drawback. Such a one-way communication link does not allow for remote access of the security system to monitor or control the system.

Other security systems exist that can provide either a redundant communication mode or two-way communication between the security system and a remote server, either accessed by a central monitoring service system or a user. The drawbacks with regard to these prior art systems are that should a dwelling already have a security system such as that described above, the legacy security system would have to be deinstalled and then replaced by a security system providing redundant communication modes and/or two-way communication. There is no capacity to add such functionality to an existing alarm system. Such replacement of a legacy security system entails high costs, as the controller unit of the legacy security system must be replaced, and the sensors need to be rewired to a new controller unit.

It is therefore desirable to provide a cost-effective solution for enabling legacy (pre-installed) security systems to be remotely controlled and monitored by either a user of the system (e.g., a home owner) or a central monitoring service system, through a plurality of continuously monitored communication modes.

BRIEF DESCRIPTION OF THE DRAWINGS

The present invention may be better understood, and its numerous objects, features and advantages made apparent to those skilled in the art by referencing the accompanying drawings.

DETAILED DESCRIPTION

Embodiments of the present invention provide a communication system that can be added to a legacy alarm system to provide a plurality of communication modes to a remote server system from the legacy alarm system and provide remote control and monitoring to a user of the system via two-way communication links. Embodiments of the present invention can be configured to communicate with an alarm processor of the alarm system through use of a keypad bus typically used by the legacy alarm system for communications between the alarm processor and one or more keypads.

Communication modes that can be provided by embodiments of the present invention can include, for example, communication over a public switched telephone network, cellular transmission, broadband transmission, and the like. Embodiments of the present invention can monitor all configured communication modes and determine which communication mode is the best for providing communication between the alarm system and the remote server. Through these communication modes and by virtue of being coupled to the alarm processor via the keypad bus, embodiments of the present invention can provide both transmission to the remote server of the status and alarm condition of the legacy alarm system as well as provide control signals from the remote server to the legacy alarm system.

Figure 1:
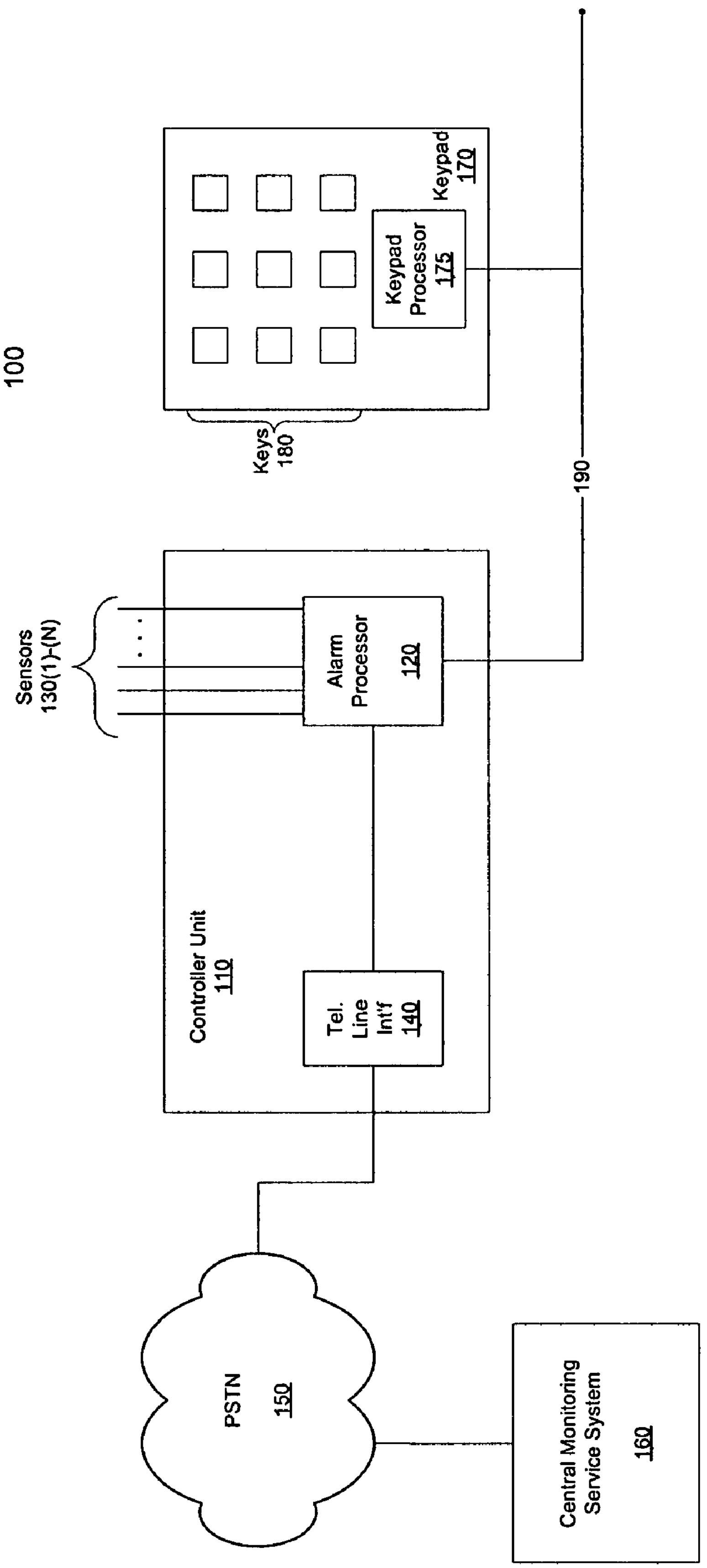
FIG. 1 is a simplified block diagram illustrating elements of an alarm system usable with embodiments of the present invention.

FIG. 1 is a simplified block diagram illustrating elements of a legacy alarm system 100. Alarm system 100 includes a controller unit 110. Controller unit 110 includes an alarm processor 120, which is coupled to sensors 130(1)-(N). Sensors 130(1)-(N) can be installed at various points of entry for a building to detect when such a point of entry is reached, and can also include, for example, motion, smoke, and fire detectors. Alarm processor 120 can define zones each of which can include one or more alarm sensors 130(1)-(N). Alarm processor 120 is further coupled to a telephone line interface 140. In the event of a triggering of one of sensors 130(1)-(N), alarm processor 120 can instruct telephone line interface 140 to dial a call through public switched telephone network (PSTN) 150 to a central monitoring service system 160. Alarm processor 120 can then send data through the connection to the central monitoring service system, providing information related to the type of security breach (e.g., identification of zone, fire or intrusion alarm, etc.).

Alarm processor 120 is also coupled to a keypad 170. Keypad 170 allows a user in the building to control the alarm system by performing tasks such as arming and disarming the alarm system, activating an alarm sequence to activate an audible alarm and call to the central monitoring service system, sending a silent distress signal to the central monitoring service system, and programming and configuring alarm system 100. Keypad 170 includes a keypad processor 175, which is coupled to keys 180 through which the user can enter commands. Keypad 170 can also include, for example, visual indicators of the status of the alarm system such as LEDs or a display, which are coupled to the keypad processor. Alarm processor 120 is coupled to keypad processor 175 through a keypad bus 190. Keypad bus 190 provides communication between the alarm processor and keypad processor using, for example, a serial digital protocol transmitted and received by the processors. One or more keypads can be connected to the alarm processor via the keypad bus.

Through the use of the keypad bus serial digital protocol, the alarm processor can provide to the keypad information such as whether the alarm is armed or disarmed, and whether zones are tripped or not. The keypad processor can provide arming codes and other control information to the alarm processor.

Figure 2:
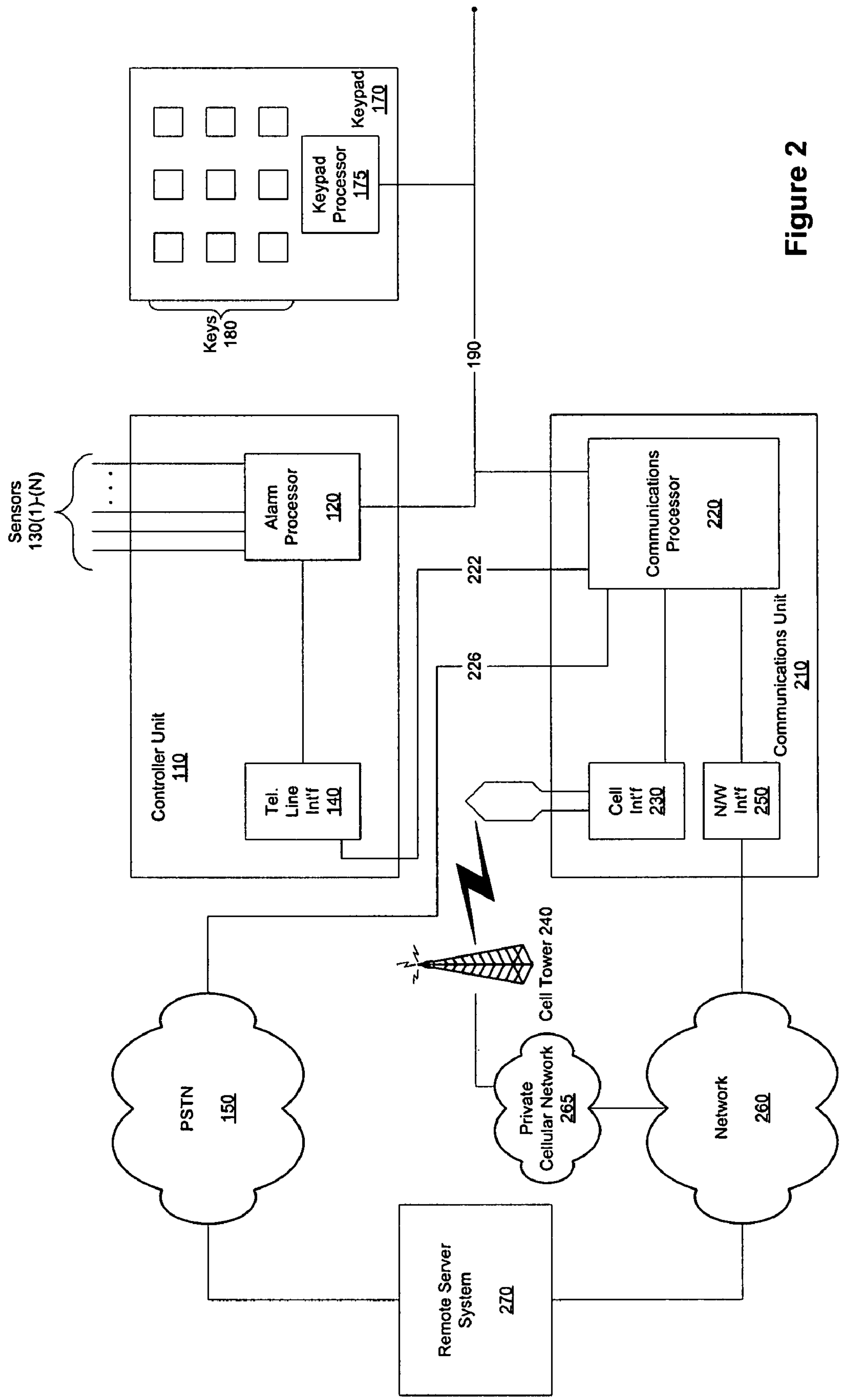
FIG. 2 is a simplified block diagram of components of a legacy alarm system coupled to a communications system, in accord with embodiments of the present invention.

FIG. 2 is a simplified block diagram of components of a legacy alarm system coupled to a communications system in accord with embodiments of the present invention. As discussed above, alarm controller 110 includes a microprocessor 120 that is coupled to sensors 130(1)-(N). Alarm processor 120 is coupled via keypad bus 190 to keypad processor 175 within keypad 170. Communications unit 210 provides a communications processor 220 that is coupled to alarm processor 120 and keypad processor 175 via keypad bus 190. Thus, communications processor 220 can exchange data with alarm processor 120 using the serial digital protocol of keypad bus 190. Communications processor 220 can be configured to automatically determine the type of serial digital protocol being used in communications between alarm processor 120 and keypad processor 175 as part of an initial configuration of communications unit 210 upon being coupled to the keypad bus.

Communications processor 220 is also coupled to controller unit 110 via telecommunications link 222, which is coupled to the outgoing port of telephone line interface 140. Communications processor 220 is further coupled to PSTN 150 by telecommunications link 226, thereby breaking the direct link between telephone line interface 140 and PSTN 150 illustrated in FIG. 1. Communications processor 220 then serves as an intermediary between alarm unit 110 and PSTN 150. It is through this link that communications processor 220 can provide communication from alarm controller unit 110 to a remote server system 270 via the PSTN, should that be a selected communication mode (as described below).

Remote server system 270 can be a network-coupled computer system that provides, in part, responsive communication to information received from communications unit 210. Such responsive communication can be provided to, for example, the user of the alarm system (e.g., a homeowner) or to emergency responders to alarm conditions. Remote server system 270 can also provide communication to communications unit 210, including, for example, configuration information and updates.

Communications processor 220 can also be coupled to a cellular interface 230 that can provide cellular transmission to a cell tower 240 that is also coupled, directly or indirectly, to a private cellular network 265, which is further coupled to a network 260. Through this link, communications processor 220 can provide a cellular transmission communication mode to server system 270, which is also coupled to network 260.

Communications processor 220 can also be coupled to a network interface 250. Network interface 250 can provide a broadband connection to network 260 (e.g., the Internet), which is also coupled to server system 270. Through network interface 250, communications processor 220 can provide a broadband communications mode to server system 270.

In alternate embodiments of communications unit 210, communications processor 220 can be coupled to other communication interfaces that can provide wireless broadband, Wi-Fi communication, and the like.

The multiple communication modes provided by communication unit 210 avoid the single point of failure (e.g., an external telephone line) present in legacy alarm systems. To this end, it is preferable that multiple communication modes not be transmitted over a common link from a building in which an alarm system is installed.

Communications processor 220 can monitor all of the available communication modes to determine which communication mode is the best for transmitting data to and from server system 270 at any point in time. For example, the communications processor, through network interface 250, can monitor whether there is an active connection to network 260. Such monitoring can be performed by, for example, by periodically establishing, or attempting to establish, a connection with server system 270 and monitoring a heartbeat signal. Alternatively, the communications processor can determine availability and viability of a network connection to the server system using, for example, network echo packets (e.g., pinging). Similarly, through cellular interface 230, communications processor 220 can periodically establish, or attempt to establish, a connection with server system 270 through private cellular network 265 and network 260. With regard to connections via PSTN 150, the communications processor can, for example, determine whether there is an appropriate voltage over the telecommunications link 226 from the PSTN. In an event of a voltage drop on telecommunications link 226, the communications processor can interpret such a drop as an event that needs to be communicated to the remote server (over either the broadband or cellular connection).

As the communications processor determines the best communication mode, that mode is then used for communication between communication unit 210 and server system 270 until a determination is made that an alternate communication mode is more appropriate. Alternatively, the communications processor can be configured to give primary preference to a particular communications mode (e.g., broadband), and then secondary preference to a different communications mode (e.g., cellular), and so on. In such a case, the communications processor will use the primary communications mode unless that communications mode is unavailable and then switch to a secondary (or lower) communications mode, depending upon availability of that mode.

As stated above, communications processor 220 and alarm unit 110 are coupled over telecommunications link 222 in order for the communications processor to function as an intermediary between the alarm unit and PSTN 150. In a legacy system, when alarm processor 120 detects an alarm situation, alarm processor 120 instructs telephone line interface 140 to dial out over PSTN 150 to communicate with the central monitoring service system. Communications processor 220 can simulate the phone service and the central monitoring system and interpret the alarm signals provided by alarm processor 120. Alarm processor 120 provides such communication using, for example, a ContactID format. Communications processor 220 can read the data supplied by alarm processor 120 over the telecommunications link, interpret that data, and transmit an appropriate signal over the chosen communication mode to server system 270.

Communications processor 220 can also interpret signals provided by alarm processor 120 over keypad bus 190, and provide that information to server system 270 over the chosen communication mode. As stated above, such information can include arm/disarm indicators, zone trip information, system trouble (e.g., low battery, clock reset, no power), and the like.

Communications processor 220 can also receive information provided by server system 270 over a communication mode selected by the server system. Communications processor 220 can interpret that received information and format the information for the appropriate serial digital protocol of keypad bus 190. Communications processor 220 can then provide the information to alarm processor 120 over keypad bus 190. Through such communication, communications processor 220 emulates keypad communication to alarm processor 120. Thus, there is no need to reprogram the legacy alarm system to allow the legacy alarm system to be controlled through communication unit 210.

Figure 3:
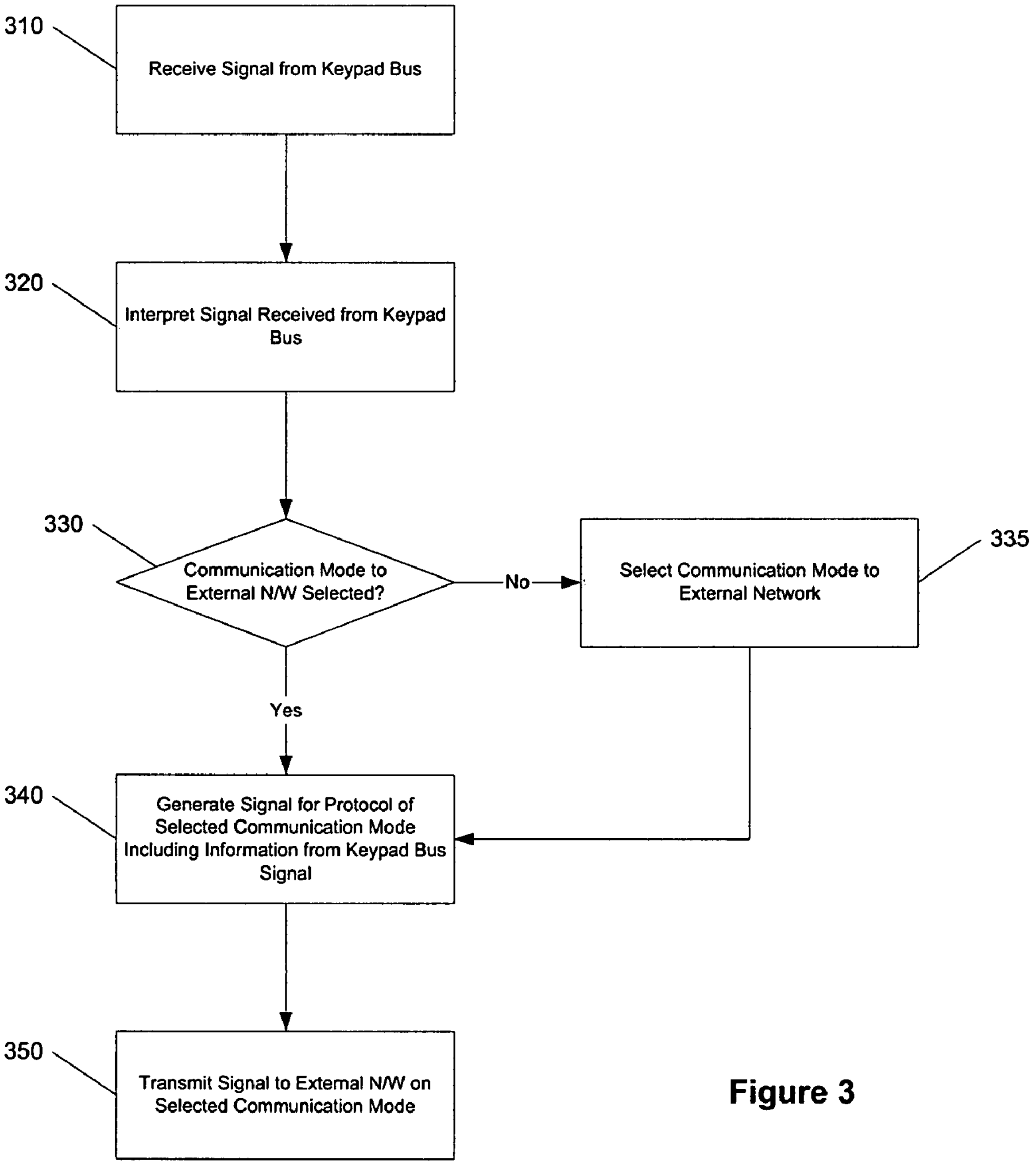
FIG. 3 is a simplified flow diagram illustrating steps performed in providing a signal received from a keypad bus to an external network over a selected communication mode, in accord with embodiments of the present invention.

FIG. 3 is a simplified flow diagram illustrating steps performed in providing a signal received from a keypad bus to an external network over a communication mode, in accord with embodiments of the present invention. A data signal is received from a connection to a keypad bus (310), for example, by a communications processor 220. Prior to receiving the signal, and typically upon initial startup of the communications unit when connected to the keypad bus, an identification of the serial digital protocol of the keypad bus is made. Such a determination of the keypad bus protocol can be made by one of several methods including, for example, analyzing the received data signal from the keypad bus and comparing that signal to expected signal formats for keypad bus protocols, or transmitting a test command from one of a plurality of possible keypad bus protocols and analyzing a received responsive signal for conformity with the protocol of the transmitted signal, or analyzing signals transmitted by a keypad 170 in response to a predetermined code entered into keys 180, or analyzing timing parameters of the serial digital signal to determine the protocol type.

Using the determined keypad bus protocol, the signal received from the keypad bus can be interpreted (320). This interpretation can include determining the nature of the keypad bus signal (e.g., arm/disarm, zone tripped/not tripped, alarm controller status). A determination can then be made as to whether a communication mode to an external network has been previously selected (330). If not, then a selection of a communication mode to the external network can be made (335). As discussed above, the selection of a communication mode is made in response to periodic or continuous monitoring of the communication modes available to the communications unit. When a communication mode has been selected, a signal can then be generated corresponding to the protocol of the selected communication mode, wherein that signal includes information corresponding to the signal received from the keypad bus (340). That generated signal can then be transmitted to the external network via the selected communication mode (350). In order to perform such a transmission, it may be necessary to establish a link with the external network and ultimately to a remote server system coupled to the external network (e.g., 270) in order to effect the data transfer.

Figure 4:
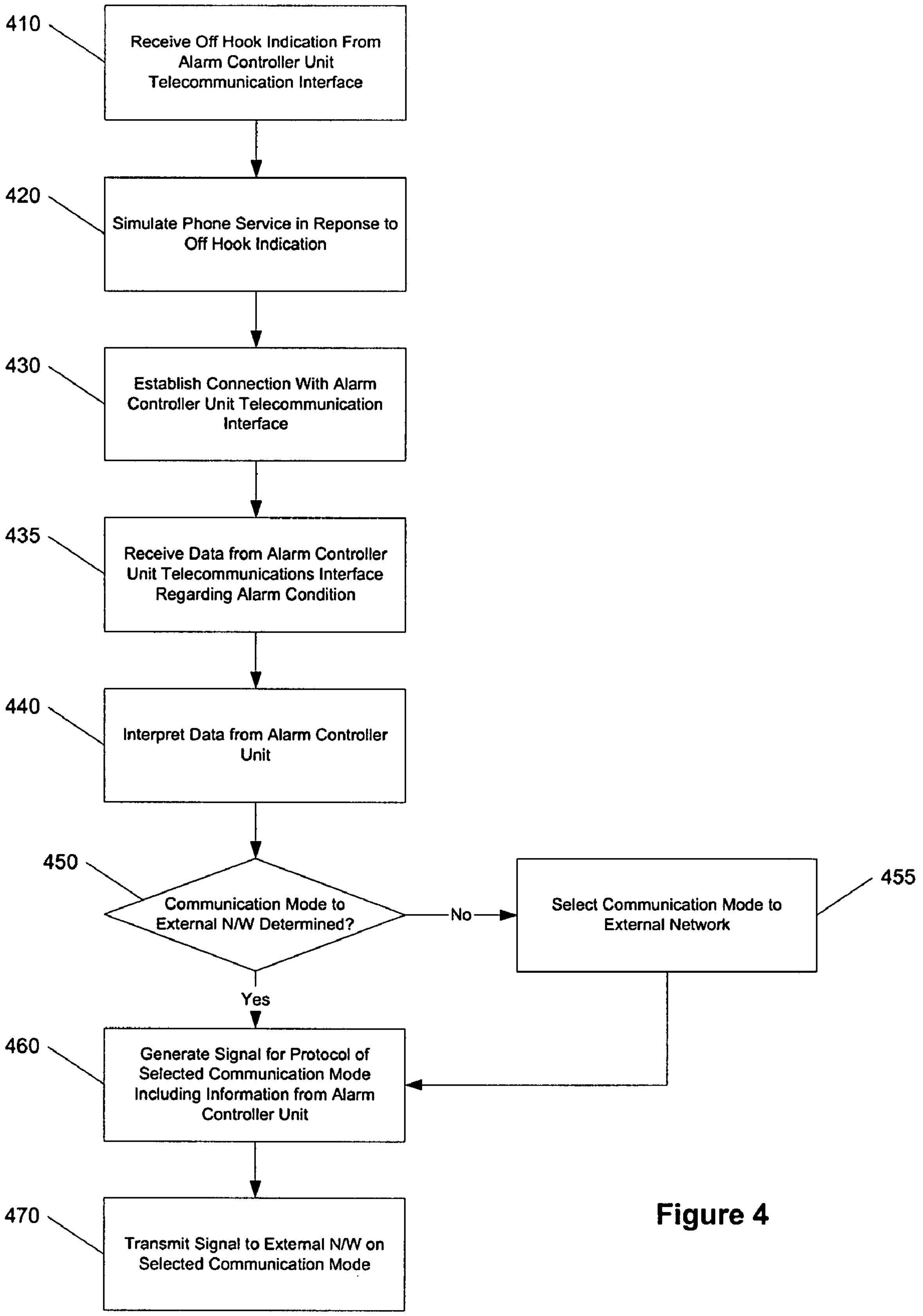
FIG. 4 is a simplified flow diagram illustrating steps for providing information in an alarm signal received from alarm processor's telephone interface to an external network, in accord with embodiments of the present invention.

FIG. 4 is a simplified flow diagram illustrating steps for providing information in an alarm signal received from alarm processor's telephone interface to an external network, in accord with embodiments of the present invention. As discussed above, upon detecting an alarm condition, such as a sensor breach, an alarm processor of a legacy alarm system will use a phone line to contact a central monitoring service system. Embodiments of the present invention are coupled to the telephone interface of the legacy alarm system and will receive an off hook indication generated by the alarm controller unit telecommunication interface (410). In response to receiving the off hook indication, the communications processor can simulate the response to the off hook signal expected by the alarm controller unit (420). A "connection" will then be established between the alarm controller unit's telecommunication interface and the communications processor (430), for example, by the communications processor simulating responses that the alarm controller unit would expect to receive from a central monitoring service system (e.g., a handshake signal).

The alarm processor will then provide data related to the alarm condition that triggered the dial out. This data will be received from the alarm controller unit's telecommunications interface (435). Such data can be provided in a form of, for example, a set of dual tone multi-frequency signals (e.g., tone dialing) or through a modem-like exchange. The received data can then be interpreted, for example, in accord with the ContactID format (440). As with FIG. 3, a determination can be made as to whether a communication mode for communicating over an external network to a remote server has been selected (450). If a communication mode has not been selected, then a communication mode can be selected from among the available communication modes, as discussed above (455). Once a communication mode has been selected, a signal can be generated in the protocol of the selected communication mode that includes the information received from the telephone interface (460). The generated signal can then be transmitted to the external network via the selected communication mode. In this manner, alarm conditions can be supplied to a remote server system coupled to the selected external network.

Figure 5:
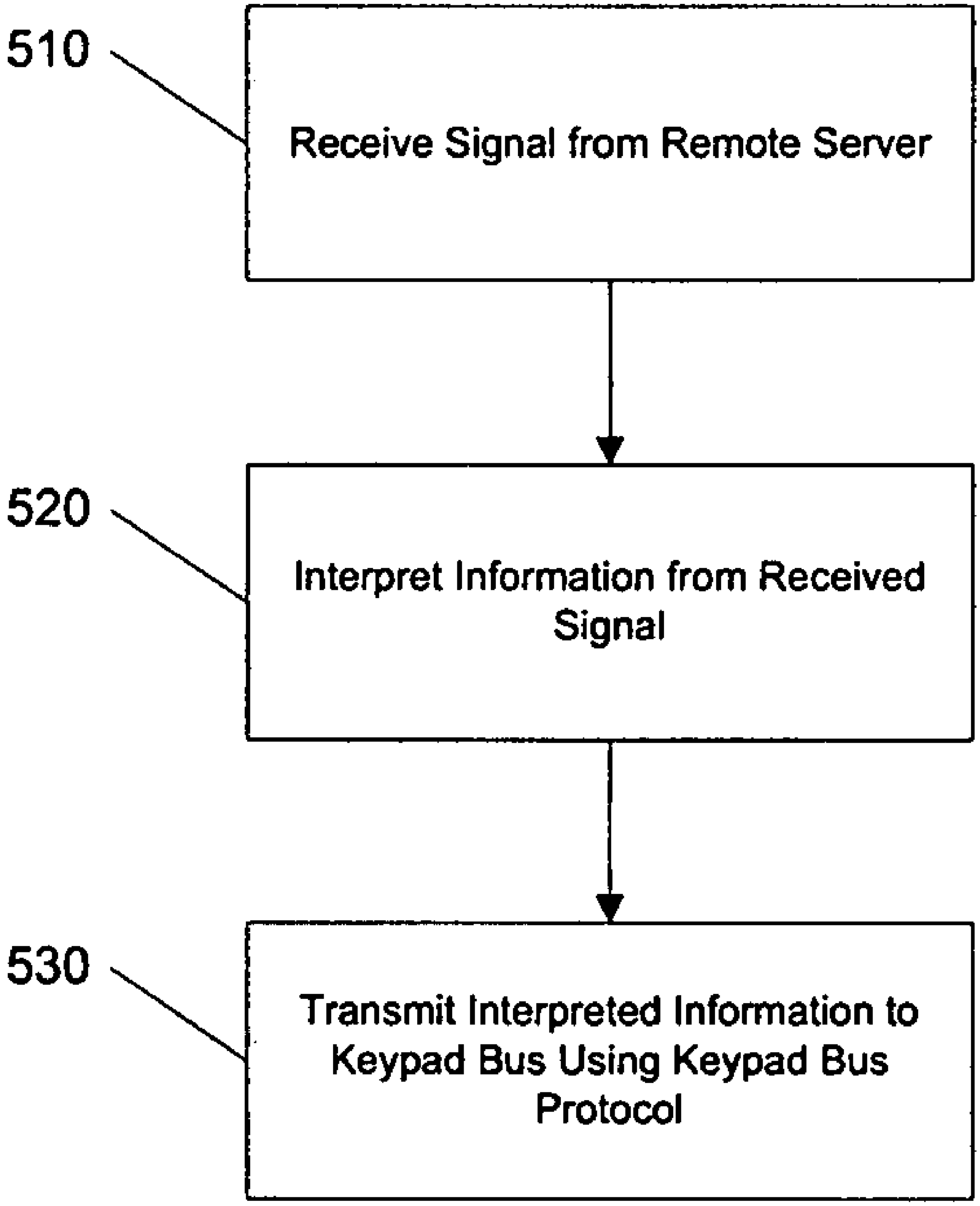
FIG. 5 is a simplified flow diagram illustrating steps performed in providing control information generated by a remote server to a legacy alarm system, in accord with embodiments of the present invention.

FIG. 5 is a simplified flow diagram illustrating steps performed in providing control information generated by a remote server to a legacy alarm system, in accord with embodiments of the present invention. For example, in response to a user command or for network system maintenance, a remote server (e.g., 270) can generate a signal containing control information for the legacy alarm system. The remote server can transmit that information to the control unit via a communication mode selected by the remote server. While the remote server can be periodically provided with information related to the communication unit's selected communication mode (as well as other status information related to the communication unit), the remote server can itself determine a preferred communication mode and use that mode. The remote server can track and provide information regarding the communication unit's selected communication mode.

A signal from the remote server containing the control information can be received (510). The received signal can then be interpreted to determine the nature of the control information contained in the signal (520). The interpreted information can then be transmitted to the keypad bus using a signal formatted for the appropriate keypad bus protocol (530).

One of the advantages of the present invention is that the communication unit provides two-way communication over a plurality of communication modes to a legacy alarm system. Thus, without replacing the legacy alarm system, a user of the system gains added functionality such as redundant connectivity and the ability to monitor and remotely control the legacy alarm system. Such an addition of functionality, rather than a whole scale replacement of an alarm system, can be provided at a substantially lower cost than replacing the system.

Figure 6:
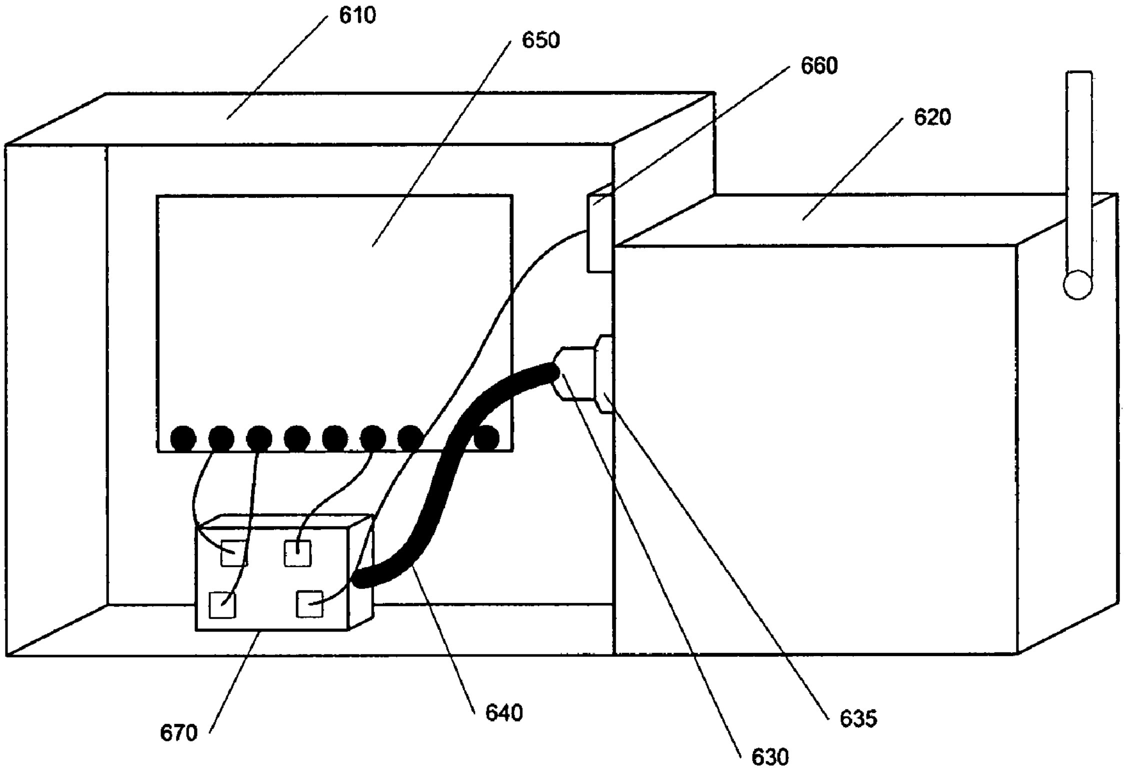
FIG. 6 is a simplified block diagram illustrating one example of a connection between a communication unit and a legacy alarm system controller, in accord with embodiments of the present invention.

FIG. 6 is a simplified block diagram illustrating one example of a connection between a communication unit 210 and a legacy alarm system controller unit 110. Typically, a legacy alarm system controller is housed in a wall-mounted metal housing 610. Such an alarm system controller housing will typically have a key-lockable door (not shown) in order to restrict access to the circuitry and connections inside. One embodiment of a communications unit of the present invention can be housed in a housing 620 that can be attached to the alarm control unit housing 610. Coupling between communications unit housing 620 and alarm control unit housing 610 can be performed by creating a hole in the alarm control unit's housing (typically by cutting out a pre-etched punch out in the housing) and passing through that hole a connector 630 that is rigidly mounted to the exterior of the communication unit housing and securing that connector to the alarm control unit's housing 610 (e.g., through use of a nut 635 threaded on the connector). Connector 630 can allow for passage into alarm control unit housing 610 of a cable 640 that includes necessary connector wires for coupling the communications unit to, for example, alarm system power, the keypad bus, and the telecommunications link to the alarm processor (all coupled to an alarm printed circuit board 650), and the telephone line interface 660. Typically, connections can be made to the alarm system power, keypad bus, etc. through already present screw down connections coupled to the alarm printed circuit board, or to modular jack connections (e.g., the telephone line interface). For ease of providing such connections, cable 640 can terminate in a hub 670 that provides connectors for the various coupling lines to the alarm printed circuit board 650 and telephone line interface 660. Thus, connection of a communications unit to the alarm system can be performed by a homeowner, rather than a paid installer, thereby further reducing the cost, both to the user and to a supplier of the communications unit.

Embodiments of the present invention therefore provide a cost-effective solution for providing a legacy alarm system with a capacity to communicate over a selected one of a plurality of communication modes, thereby avoiding a single point of failure of many legacy alarm systems, and provides the added functionality of two-way communication from a remote server allowing control over the legacy alarm system from a location other than within the premises in which the alarm system is installed.

Other Embodiments

The present invention is well adapted to attain the advantages mentioned as well as others inherent therein. While the present invention has been depicted, described, and is defined by reference to particular embodiments of the present invention, such references do not imply a limitation on the invention, and no such limitation is to be inferred. The invention is capable of considerable modification, alteration, and equivalents in form and function as will occur to those ordinarily skilled in the pertinent arts. The depicted and described embodiments are examples only, and are not exhaustive of the scope of the invention.

The foregoing describes embodiments including components contained within other components (e.g., the various elements shown as components of communications unit 210). Such architectures are merely examples, and, in fact, many other architectures can be implemented which achieve the same functionality. In an abstract but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected" or "operably coupled" to each other to achieve the desired functionality.

The foregoing detailed description has set forth various examples of the present invention via the use of block diagrams, flow charts, and examples. It will be understood by those within the art that each block diagram component, flow chart step, operation and/or component illustrated by the use of examples can be implemented, individually and/or collectively, by a wide range of hardware, software, firmware, or any combination thereof.

The above description is intended to be illustrative of the invention and should not be taken to be limiting. Other embodiments within the scope of the present invention are possible. Those skilled in the art will readily implement the steps necessary to provide the structures and the methods disclosed herein, and will understand that the process parameters and sequence of steps are given by way of example only and can be varied to achieve the desired structure as well as modifications that are within the scope of the invention. Variations and modifications of the embodiments disclosed herein can be made based on the description set forth herein, without departing from the scope of the invention.

Consequently, the invention is intended to be limited only by the scope of the appended claims, giving full cognizance to equivalence in all respects.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:

1. A system comprising:

an alarm system comprising a keypad bus directly connected to an alarm processor and a keypad processor, wherein the keypad bus provides communication between the alarm processor and the keypad processor; and a communications processor directly connected to the keypad bus and configured to communicate with a network external to the system using a plurality of communication modes, and communicate with the alarm processor using the keypad bus connection to the alarm processor.

2. The system of claim 1 wherein the keypad bus comprises a serial digital protocol bus.

3. The system of claim 1 wherein the communications processor is further configured to detect a communication protocol used on the keypad bus; and communicate with the alarm processor using the detected communication protocol.

4. The system of claim 3, wherein the communications processor automatically performs said detecting the communication protocol.

5. The system of claim 3, wherein the communications processor performs said detecting the communication protocol by analyzing timing parameters of a serial digital signal provided on the keypad bus.

6. The system of claim 1, wherein the communication modes comprise two or more of public switched telephone network (PSTN), cellular transmission, and broadband transmission.

7. The system of claim 1 wherein the communications processor is further configured to monitor a status of each of the plurality of communication modes.

8. The system of claim 7 wherein the communications processor is further configured to select one of the plurality of communication modes in response to said monitoring of the status of each of the plurality of communication modes; and perform said communication with the external network using the selected one of the plurality of communication modes.

9. The system of claim 1 wherein the communications processor is further configured to receive a first signal from the alarm processor on the keypad bus; and transmit a second signal to the external network using a selected one of the plurality of communication modes, in response to said receiving the first signal.

10. The system of claim 9, wherein the second signal is transmitted to a server coupled to the external network.

11. The system of claim 1, wherein the alarm processor is configured to communicate using a telephone system coupling, and the communications processor is further coupled to the alarm processor using the telephone system coupling, and the communications processor is configured to communicate with the alarm processor using the telephone system coupling.

12. The system of claim 11 wherein the communications processor is further configured to:

receive alarm processor data from the telephone system coupling; and transmit a signal to the external network on a selected one of the plurality of communication modes, in response to said receiving the alarm processor data.

13. The system of claim 12, wherein the signal is transmitted to a server coupled to the external network.

14. A method comprising:

receiving, by a communications processor, a first signal on a keypad bus, wherein the keypad bus is directly connected to an alarm processor and a keypad processor, and provides a communication link between the alarm processor and the keypad processor, and the communications processor is directly connected to the keypad bus; and transmitting a second signal to an external network using a selected one of a plurality of communication modes, wherein said transmitting is performed in response to said receiving the first signal, and said transmitting is performed by the communications processor.

15. The method of claim 14 wherein the source of the first signal is the alarm processor coupled to the keypad bus.

16. The method of claim 15 wherein the first signal comprises data associated with a status of an alarm system comprising the alarm processor and the keypad bus.

17. The method of claim 14 further comprising:

monitoring a status of each of the plurality of communication modes.

18. The method of claim 17 further comprising:

selecting the selected one of the plurality of communication modes, wherein said selecting is performed in response to said monitoring.

19. The method of claim 14 further comprising:

detecting, by the communications processor, a communication protocol used for communications on the keypad bus; and transmitting, by the communications processor, a third signal to the alarm processor using the communication protocol.

20. The method of claim 19 wherein said detecting is performed automatically.

21. An apparatus comprising:

means for receiving a first signal on a keypad bus, wherein the keypad bus is directly connected to an alarm processor and a keypad processor and provides a communication link between the alarm processor and the keypad processor, and said means for receiving is directly connected to the keypad bus; and means for transmitting a second signal to an external network using a selected one of a plurality of communication modes, wherein said transmitting is performed in response to receiving the first signal.

22. The apparatus of claim 21 wherein the source of the first signal is the alarm processor coupled to the keypad bus.

23. The apparatus of claim 22 wherein the first signal comprises data associated with a status of an alarm system comprising the alarm processor and the keypad bus.

24. The apparatus of claim 21 further comprising:

means for monitoring a status of each of the plurality of communication modes.

25. The apparatus of claim 24 further comprising:

means for selecting the selected one of the plurality of communication modes, wherein said selecting is performed in response to said monitoring.

26. The apparatus of claim 21 further comprising:

means for detecting a communication protocol used for communications on the keypad bus; and means for transmitting a third signal to the alarm processor using the communication protocol.

27. The apparatus of claim 26 wherein said means for detecting comprises:

a means for automatically performing said detecting.

* * * * *